US007678409B2

(12) United States Patent
Morrison et al.

(10) Patent No.: US 7,678,409 B2
(45) Date of Patent: Mar. 16, 2010

(54) DEPOSITION OF LAYERS ON SUBSTRATES

(75) Inventors: Finlay Doogan Morrison, Cambridge (GB); James Floyd Scott, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 961 days.

(21) Appl. No.: 10/544,889

(22) PCT Filed: Feb. 5, 2004

(86) PCT No.: PCT/GB2004/000454

§ 371 (c)(1),
(2), (4) Date: Mar. 6, 2006

(87) PCT Pub. No.: WO2004/070089

PCT Pub. Date: Aug. 19, 2004

(65) Prior Publication Data

US 2006/0234032 A1  Oct. 19, 2006

(30) Foreign Application Priority Data

Feb. 5, 2003  (GB) ................. 0302655.6

(51) Int. Cl.
*B05D 5/12* (2006.01)
(52) U.S. Cl. ............... 427/58; 427/518; 427/509; 427/521; 427/98.3; 427/98.8; 210/500
(58) Field of Classification Search ............. 427/58; 210/500
See application file for complete search history.

(56) References Cited

U.S. PATENT DOCUMENTS 4,896,948 A * 1/1990 Dono et al. ............. 359/245
5,540,772 A * 7/1996 McMillan et al. .......... 118/50
5,789,024 A * 8/1998 Levy et al. ............... 427/244
6,350,686 B1  2/2002 Vaartstra (Continued)

FOREIGN PATENT DOCUMENTS

CA   2 314 406 A1   1/2002

(Continued)

OTHER PUBLICATIONS

S. Tirumala et al. Applied Physics A, vol. 70, (2000), pp. 253-259.*

(Continued)

*Primary Examiner*—Shamim Ahmed
*Assistant Examiner*—Maki Angadi
(74) *Attorney, Agent, or Firm*—Fish & Richardson P.C.

(57) ABSTRACT

A process for filling or lining the pores of a porous silicon, silica or alumina substrate with a material which exhibits voltage-dependent index of refraction n is provided comprising providing precursors for the deposited material as a precursor solution, forming a fine mist of droplets of precursor solution and applying the droplets to the porous substrate. The invention provides for the first time porous silicon, silica and alumina substrates having a fill fraction of at least 60%. Fill fractions of close to 100% can be achieved. When provided with top and bottom electrodes, filled porous silicon, silica and alumina wafers can be used as voltage-dependent photonic devices. The same process can be used for lining trenches in the surface of a silicon substrate, for instance for use in production of microelectronic devices such as random access memories.

13 Claims, 1 Drawing Sheet

U.S. PATENT DOCUMENTS 6,376,391 B1 * 4/2002 Olson et al. .................. 438/758
2002/0074537 A1 6/2002 John et al.

FOREIGN PATENT DOCUMENTS

WO  WO 01/86038 A2  11/2001

OTHER PUBLICATIONS

R. Thomas et al. Thin Solid Films, vol. 346, (1999), pp. 212-225.*

Zhou, et al., *Thermally tuning of photonic band gap of $SiO_2$ colloid-crystal infilled with ferroelectric $BaTiO_3$*, Applied Physics Letters, Jan. 29, 2001, pp. 661-663, vol. 78, No. 5.

Ottow, et al., *Development of three dimensional microstructure processing using macroporous n-type silicon*, Applied Physics A, pp. 153-159, vol. 63, 1996.

Shilling, et al., *Three-dimensional photonic crystals based on macroporous silicon with modulated pore diameter*, Applied Physics Letters, Feb. 26, 2001, pp. 1180-1182, vol. 78, No. 9.

Nishizawa, et al., *Novel chemical processing for crystallization of $SrBi_2Ta_2O_9$ thin films via UV irradiation*, Materials Letters, Jan. 2002, pp. 20-23, vol. 52, No. 1-2, North Holland Publishing Company, Amsterdam, Netherlands.

International Search Report dated Feb. 12, 2004.

* cited by examiner

DEPOSITION OF LAYERS ON SUBSTRATES

FIELD OF THE INVENTION

The invention relates in a first aspect to methods of lining or filling the pores of porous silicon, silica or alumina substrates with deposited materials having voltage-dependent index of refraction (n). It also relates to the products of such processes, in particular voltage-tunable photonic devices, and to the use of these devices.

The invention relates in a second aspect to methods of lining trenches of high aspect ratio in silicon substrates with deposited dielectric materials. It also relates to the products of such processes, in particular silicon integrated circuits.

BACKGROUND OF THE INVENTION

It is known that porous silicon Si and alumina $Al_2O_3$ substrates are useful as photonic crystals. Techniques for fabricating these porous substrates are known and have for instance been described by Ottow et al in Appl. Phys. A63, 153-159 (1996) and Schilling et al in Appl. Phys. Lett. Vol. 78, No. 9, 26 Feb. 2001, 1180-1182.

It would be desirable to be able to line or completely fill the pores in such substrates with a material of high refractive index n, n being variable with voltage. A variety of ferroelectric materials have this property, as do some non-ferroelectric materials. This would enable production of voltage-tunable photonic devices.

Zhou et al in Appl. Phys. Lett., Vol. 78, No. 5, 29 Jan. 2001, 661-663, describe the production of an $SiO_2$ colloid crystal infilled with ferroelectric $BaTiO_3$, which enhances the photonic band gap. However, this structure does not permit attachment of electrodes and does not permit voltage tunability.

Waser et al in Integrated Ferroelectrics, 2001, vol. 36, pp 3-20, review the known chemical deposition techniques. Waser et al primarily discuss thin film deposition but do describe attempts to fill holes in pore-patterned $Al_2O_3$ films with lead zirconate titanate PZT using chemical solution deposition (CSD). However, they report problems in filling the pores completely.

Related problems arise with silicon integrated circuits, in particular random access memories (RAMs). There is a need to deposit uniform coatings on the inside walls of trenches for silicon Si random-access memories, both dynamic DRAMs and non-volatile ferroelectric FRAMs. These trenches have high aspect ratio (ratio of depth to diameter), for instance 60:1 at 6-micron depth.

Dielectric materials for RAMs are generally deposited via chemical vapour deposition (CVD), sputtering, or related techniques in which the principal aims are to achieve uniform thickness along the inside walls. However, presently known systems have not solved the problem of achieving uniform deposition along substantially the entire surface of the trench.

BRIEF SUMMARY OF THE INVENTION

It would be desirable to be able to provide methods of uniformly lining or substantially completely filling the pores in porous silicon, silica and alumina substrates with a material which has voltage-dependent refractive index. This would enable the production of novel voltage-tunable photonic devices.

It would also be desirable to be able to provide methods of depositing dielectric material along the inside walls of high aspect ratio trenches in a uniform manner.

According to a first aspect of the invention we provide a process of depositing material having voltage-dependent index of refraction n in the pores of a porous silicon, silica or alumina substrate, the process comprising providing a precursor solution containing precursors for the material to be deposited, forming fine droplets of the precursor solution and contacting the fine droplets with the porous substrate. Silicon and alumina are preferred substrate materials.

We find surprisingly that using this fine mist deposition method can give a high fill fraction (percentage of pores substantially completely filled), which can be substantially 100%. Additionally, the method of the invention surprisingly allows lining of the pores (in cases where this is required instead of filling the pores), resulting in a high percentage of the internal surface of the pore being coated. This is particularly surprising given that the size of the pores in the substrate is comparable to the size of the droplets of precursor solution. Indeed, we find unexpectedly that the system of the invention gives better filling and lining efficiency than systems such as chemical vapour deposition (CVD) which might be expected to have greater effectiveness at filling and lining micron size pores. A further advantage of the present techniques over chemical vapour deposition is that the equipment involved is smaller and less complex than that required for CVD.

The process of the first aspect of the invention allows production of a highly filled porous substrate, which has not been previously achieved. Accordingly, according to a second aspect of the invention we provide a crystal formed from porous silicon, silica or alumina in which the pores are filled with a material having voltage-dependent index of refraction n and wherein the fill fraction is at least 60%, preferably at least 70 or 80%, and can even be at least 99%. Silicon and alumina are preferred substrate materials.

The product of the process of the first aspect of the invention and the product of the second aspect of the invention can be used as voltage-tunable photonic devices. Accordingly, a third aspect of the invention provides a voltage-tunable photonic device which is a porous silicon, silica or alumina substrate in which the pores have deposited on their inner surface material having voltage-dependent index of refraction n. Silicon and alumina are preferred substrate materials. In a preferred aspect, the fill fraction is at least 60%, wherein the substrate is provided with top and bottom electrodes.

In these aspects of the invention it is essential that the deposited material has index of refraction n which varies with applied voltage. Replacement of air in the pores by the deposited material alters the frequency rate of the optical gap, and this shift is a function of applied voltage. Tuning is achievable by varying an applied DC voltage across the thickness of the device.

Variation in n with applied field results in change in optical dielectric constant $\in = n^2(E, \delta)$ where $\delta$ is the optical frequency. The materials used in the invention may show a change in n of around 1% in the applied field that can be sustained without breakdown across a 100 μm silicon device. However, a 1% change results in a very large wavelength shift for the optical band gap and thus percentage changes below 1% are also useful in the invention.

Many of the materials useful in these aspects of the invention are ferroelectric, such as $BaTiO_3$, lead zirconate titanate (PZT), strontium bismuth tantalate (SBT), antimony sulfide iodide (SbSJ), and barium strontium titanate (BST).

Non-ferroelectric materials which have voltage-variable refractive index can also be used and include rutile $TiO_2$ and strontium titanate $SrTiO_3$.

In the invention a solution of precursors for the material to be deposited, in stoichiometric proportions, is provided as a fine mist of droplets. The technique used is known and has been described by McMillan et al in Integrated Ferroelectrics 1992, vol. 2, pp 351-359. In this publication the authors describe the technique as "liquid source chemical vapour deposition" but comment that this may not be appropriate nomenclature due to the many differences from standard CVD conditions.

Usually a mixture of two or more different precursors is used. According to the invention a solution of the appropriate precursor(s) is treated so as to generate a fine mist of droplets. The solvent is preferably non-aqueous. Suitable solvents include octane Other solvents may be chosen provided they have volatility appropriate to allow them to carry the precursor onto the substrate under the chosen conditions and subsequently evaporate from the porous substrate under convenient conditions. The precursor liquid is generally at a temperature of from 0 to 50° C., preferably 25 to 30° C.

The size of the droplets is generally chosen according to the size of the substrate pores. The substrates used generally have pore diameter from around 0.05 to 5 μm, often above 0.1 μm, in particular 0.3 to 4 μm. Preferably the droplets have diameter not more than 4 μm, preferably not more than 2 μm, and in particular not more than 1 μm. It is particularly preferred for the droplets to have size not more than 0.5 μm. In the invention droplets are preferably in the size range 0.1 to 0.3 μm.

The most preferred technique for generating droplets of appropriate size is ultrasound. For instance, a piezoelectric transducer resonating at approximately 1.5 MHz can be used.

The droplets generated are carried into the deposition chamber by an inert carrier gas such as nitrogen or argon. Alternatively, a non-inert gas can be advantageous in some circumstances, such as a mixture of 50% argon/50% oxygen. Suitable carrier gas flow rates are from 50 to 200 cm$^3$/min.

Deposition generally takes place at a rate of from about 15 to 300 Å/min.

Preferably the substrate is illuminated with ultraviolet radiation during the deposition process. Generally radiation in the near UV range (300 to 400 nm) is effective.

To aid penetration of mist droplets into the pores, the substrate can be held stationary. However, rotating the substrate is also possible.

Deposition is carried out under vacuum but an advantage of the process of the invention is that high vacuum is not required. For instance pressure of 0.2 atmospheres and above, preferably 0.4 atmosphere and even around 0.5 atmospheres, can be used. This compares favourably with many known deposition techniques which require vacuum of the order of 0.01 atmospheres. Generally pressure is not more than 0.9 atmospheres, preferably not more than 0.8 atmospheres. Preferably it is in the range 0.65 to 0.90 atmospheres.

A further advantage of the process of the first aspect of the invention is that it may be carried out at ambient temperature. Although a wide variety of temperature ranges may be used, for instance from 0 to 100° C., temperatures in the range 15 to 40° C. and especially 20 to 30° C. are preferred.

In this aspect the substrate is preferably porous silicon or alumina, often in the form of a wafer. The dimensions of the substrate are chosen according to the intended final application. However, width and length are, independently, generally from 0.1 to 10 cm, preferably 0.5 to 5 cm. Thickness can be from 1 to 200 μm, preferably 10 to 100 μm.

Suitable pore configurations are known. The pores may be in a two dimensional array such as described by Ottow et al or a three dimensional array such as described by Schilling et al. In a three-dimensional array, "pore diameter" discussed above is the minimum diameter. Both rectangular/orthogonal and hexagonal arrays are available. Generally the pores are substantially cylindrical, substantially parallel and extend through the thickness of the substrate. The aspect ratio (ratio of depth to diameter) is generally high, for instance at least 5, preferably at least 10 or even at least 50.

Once the droplets of precursor solution have been deposited within the pores it is usually necessary to heat the substrate in order to evaporate the carrier solvent. This is particularly appropriate for metal alkoxide precursors. Appropriate temperatures may be chosen according to the solvent and the precursors but are preferably in the range 200 to 400° C., preferably 250 to 350° C.

Alternatively, the deposited film may be allowed to hydrolyse at ambient temperature (eg about 15 to 30° C., generally 20 to 25° C.). This is particularly appropriate for metal carboxylate precursors.

Although the method of this aspect of the invention can be carried out as a single stage process in which all deposition is carried out prior to any evaporation, we find that, when filling of the pores is required, the most effective filling efficiency can be achieved by means of a multi-stage process, in which, after some deposition has taken place, deposition of droplets is suspended and the substrate is heated to within the temperature ranges discussed above to induce evaporation of the solvent. Further deposition is then carried out, followed by a further evaporation stage. Thus the process of the invention may involve two, three or even more (for instance up to six) separate deposition and evaporation stages. As many stages are used as are necessary to achieve the desired fill fraction.

We believe that the filling mechanism involves adhesion to the pore walls rather than filling from the bottom up, which has the advantage of faster filling and more even release of organic material from the coating.

Once the appropriate level of deposition has been achieved, it is generally appropriate to subject the filled substrate to annealing so as to convert the deposited material to the appropriate crystalline form. The time and temperature required depend upon the material desired and the precursors used. When the substrate is silicon, lower annealing temperatures are preferred as this minimises oxidation of the substrate surface. Suitable annealing times are from 5 mins to 2 hours, preferably 15 mins to 1 hour, eg around 30 mins. Suitable annealing temperatures are generally in the range 600 to 850° C., preferably at least 650° C. and/or not more than 800° C.

Precursors may be selected from organometallic complexes such as metal carboxylates and metal alkoxides. Suitable precursors include $Bi(thd)_3$, $SrTa_2(OEt)_{10}(dma_2$ and $Ta(OEt)_4(dmae)$ and $Bi(mmp)_3$. In these formulae thd is tetramethylheptadiamate, dmae is dimethylaminoethanolate, and mmp is methoxymethylpropanolate. $Bi(mmp)_3$ has not previously been described as a precursor for Bi in ferroelectric materials. According to a fourth aspect of the invention we provide the use of $Bi(mmp)_3$ as a bismuth precursor in a ferroelectric material. $Bi(mmp)_3$ has improved stability over other Bi alkoxides and exhibits better compatibility with Sr—Ta alkoxide precursors.

When filling is required, the final fill fraction achieved after deposition, evaporation, and annealing if necessary, is generally at least 60%, preferably at least 70 or 80%, more preferably at least 95% and the invention can even achieve fill fraction of at least 99%.

For use as a voltage-tunable photonic device the filled or lined porous substrate must be provided with electrodes, generally at the top and bottom surfaces between which the pores extend. The bottom electrode may be applied before or after the deposition process. In some circumstances it is preferable for it to be applied after the deposition process so as to minimise potential hindrance of the evaporation stage. For silicon substrates the bottom electrode is preferably platinum, generally in combination with a precoating of titanium between the silicon and platinum layers to improve adhesion. For alumina substrates any electrode metal may be used, for instance aluminium or gold.

The top electrode is provided after deposition. Suitable top electrodes include tungsten probe tips or a mask-aligned metal array. The top electrode should be smaller than the pore diameters to avoid shorting through the substrate.

Devices made in this way and devices according to the second aspect of the invention may be used tunable photonic devices. For instance they can be used for switching optical lasers. Other applications incorporate capacitors associated with each filled pore and can form the basis of a flat panel display.

The thickness of the device will influence the voltage required to effect switching. The voltage required also depends on the deposited material chosen. For instance, PZT in constrained geometries generally has a coercive field of about 60 kV/cm. Thus in order to produce switching across a 100 μm device, 600 V must be applied. Choice of crystals of lower thickness enables lower voltages to be applied. For instance a device of thickness 20 μm would allow use of 120 V.

The methods described above are also useful in depositing dielectric layers in trenches in silicon integrated circuits. Thus in a fifth aspect of the invention we provide a process of depositing dielectric material on the inside surface of a trench in the surface of a silicon or silica (preferably silicon) substrate, the process comprising providing a precursor solution containing precursor for the material to be deposited, forming the precursor solution into fine droplets and contacting the fine droplets with the silicon substrate to effect deposition of the precursor solution on the inside surface of the trench.

The method of the invention surprisingly allows the provision of uniform coatings as thin as 40 nm at fast and commercially useful deposition rates, in trenches of high aspect ratio. This is in contrast with known methods which use liquid precursor solutions, which result in an array of surface droplets that form a meniscus atop each trench.

In this aspect of the invention the substrate is a silicon (or silica) substrate provided with one or more trenches. The trenches generally have high aspect ratio (ratio of depth to width) of from 30:1 to 100:1, preferably from 50:1 to 70:1, typically about 60:1. For instance depth can be from 1 to 10 μm, for instance typically about 6 μm, but can be as much as 40 or 80 μm. Trench diameter is typically from 0.01 to 1 μm, for instance 0:05 to 0.5 μm, typically around 0.1 μm.

This aspect of the invention uses any of the process features discussed above in connection with the process of the first aspect of the invention, where applicable.

In this fifth aspect of the invention the deposited material is dielectric. That is, it is an electrical insulator with a large dielectric constant. For use in ferroelectric RAMs (FRAMs) the deposited material must also be ferroelectric. In this case preferred deposited materials are lead zirconate titanate (PZT), strontium bismuth tantalate (SBT), and bismuth titanate (with or without lanthanum doping) (BiT). In other applications, such as production of dynamic RAMs (DRAMs) the preferred materials are hafnium oxide ($HfO_2$) tantalum oxide ($Ta_2O_5$), zirconium oxide ($ZrO_2$) and hafnium silicate (Hf-$SiO_4$).

This aspect of the invention is particularly useful for the provision of silicon integrated circuits having increased capacitance, particularly RAMs.

The deposited material must be dielectric. Preferably also it has high breakdown voltage.

The coatings on the inner surfaces of the trenches are thin, and can be of thickness below 200 nm, in particular below 160 nm and can even be below 100 nm, for instance from 20 to 60 nm. Uniformity of such thin coatings has not previously been achievable by conventional CVD or sputtering techniques used for lining silicon trenches in microelectronic devices. The top to bottom step coverage is preferably at least 0.80, more preferably 0.90, especially at least 0.99. The stoichiometry variation is preferably not more than 10%, more preferably not more than 5%.

In this and the first aspect of the invention we believe that the process of the invention produces charged droplets, typically having negative charge, often around 5e. We believe that this is particularly combination with silicon surfaces containing pores or trenches because the processing procedures for preparing some kinds of silicon pores result in a net positive charge on the inside of the silicon trenches or pores. This may contribute to the remarkable uniformity of the coating of the liquid droplets on the inner surfaces of the pores and trenches in the processes of the invention.

An embodiment of the process of the first aspect of the invention is described below.

DETAILED DESCRIPTION

Figure 1:
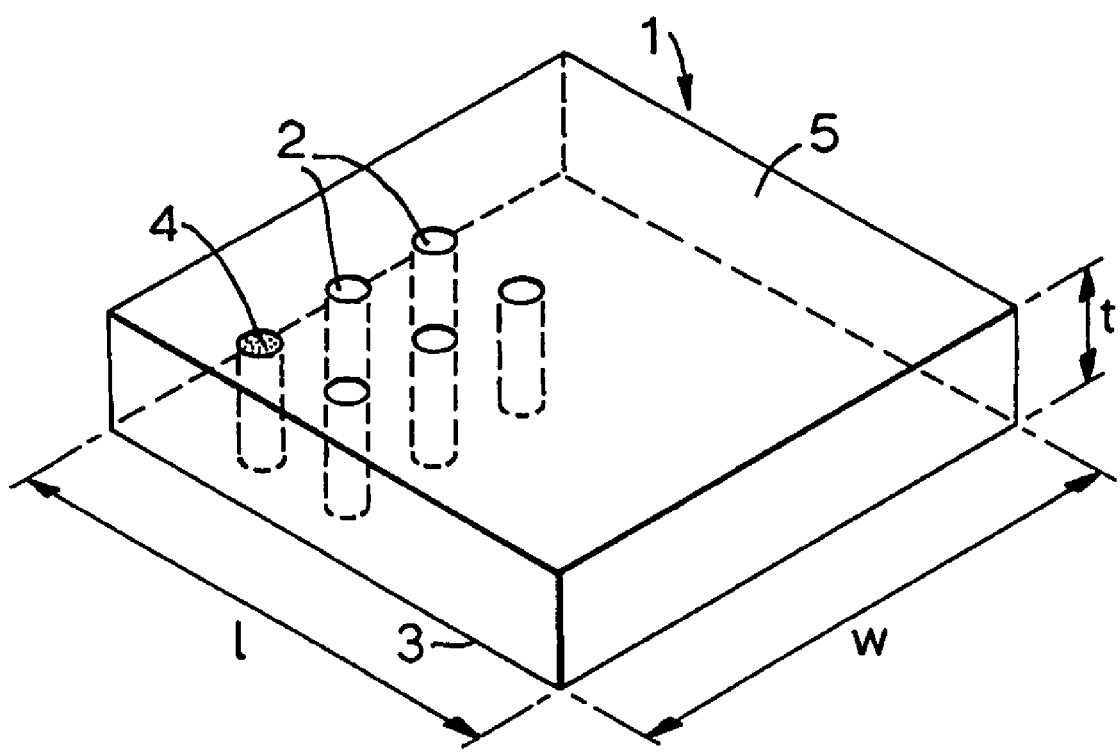
FIG. 1 is a schematic illustration of a device according to the invention.

A substrate 1 of silicon or alumina is provided in the form of a wafer having length (l) and width (w) each about 1 cm and thickness (t) about 50 μm having a two-dimensional array of pores 2 of diameter about 3 μm extending from the upper surface 5 to the lower surface 3.

A solution is formed in octane or toluene of $SrTa_2(OEt)_{10}$ $(dmae)_2$ and $Bi(mmp)_3$ in a ratio to provide as the deposited material $Sr_{0.8}Bi_{2.2}Ta_2O_{9+\delta}$. The liquid precursor mixture is formed into droplets of size around 0.3 μm by use of a piezoelectric transducer and the droplets carried into a deposition chamber containing the porous substrate on an inert gas. No heating is applied in the deposition chamber. Pressure is from 0.65 to 0.90 atmospheres. The porous substrate is illuminated with UV radiation during deposition.

Deposition is carried out for a period of 20 to 30 minutes and then suspended. The substrate is heated to a temperature of around 300° C. for 10 minutes. Deposition is then resumed, followed by further heating. This deposition and heating cycle is repeated up to 5 or 6 times.

When deposition is complete the substrate is heated to 800° C. for 30 minutes to provide a fully crystalline, single phase SBT deposit within the pores 2 of the substrate 1.

After deposition is complete a bottom electrode layer is applied to the lower surface 3 of the filled substrate. A coating of titanium is applied followed by platinum. The top electrode is in the form of tungsten probe tips 4.

The invention claimed is:

1. A process of depositing material having a voltage-dependent index of refraction n in the pores of a porous silicon, silica or alumina substrate, comprising providing a precursor solution containing precursors for the material to be deposited, forming the precursor solution into fine droplets and contacting the fine droplets with the porous substrate to effect deposition of the precursor solution in the pores, wherein the droplets have diameters of not more than 2 μm and wherein the pores are either in a two-dimensional array and have diameters of from 0.05 to 5 μm or are in a three-dimensional array and have a minimum diameter of from 0.05 to 5 μm.

2. The process according to claim 1, wherein the precursor solution is a solution in a non-aqueous solvent.

3. The process according to claim 1, further comprising the step of irradiating the substrate with UV radiation during deposition.

4. The process according to claim 1, wherein deposition takes place in a deposition chamber in which the temperature is from 15 to 40° C.

5. The process according to claim 1, wherein deposition takes place in a deposition chamber in which the pressure is from 0.2 to 0.9 atmospheres.

6. The process according to claim 1, further comprising the steps of (1) carrying out deposition for a predetermined period, (2) suspending deposition, (3) heating the substrate in order to evaporate solvent from the precursor solution, (4) carrying out further deposition for a further predetermined period, (5) suspending deposition, and (6) further heating the substrate in order to evaporate solvent from the precursor solution.

7. The process according to claim 1, further comprising annealing the deposited material by heating.

8. The process according to claim 1, wherein the substrate has upper and lower surfaces between which the pores extend and the process additionally comprises providing electrodes on the upper and lower surfaces.

9. The process according to claim 1, wherein deposition of the precursor solution in the pores results in filling of the pores with material having a voltage-dependent index of refraction n.

10. The process according to claim 1 in which deposition of the precursor solution in the pores results in lining of the pores with material having voltage-dependent index of refraction n.

11. The process according to claim 1, wherein the droplets have diameters from 0.1 to 0.3 μm.

12. The process according to claim 1, wherein the pores are in a two-dimensional array and have diameters of from 0.3 to 4 μm.

13. The process according to claim 1, wherein the pores are in a three-dimensional array and have a minimum diameter of from 0.3 to 4 μm.

* * * * *